(12) United States Patent
Chung et al.

(10) Patent No.: US 11,503,711 B2
(45) Date of Patent: Nov. 15, 2022

(54) METHOD FOR INSERTING DUMMY CAPACITOR STRUCTURES

(71) Applicant: Taiwan Semiconductor Manufacturing Co., Ltd., Hsin-Chu (TW)

(72) Inventors: Shu-Wei Chung, Hsinchu (TW); Yen-Sen Wang, Hsinchu (TW)

(73) Assignee: TAIWAN SEMICONDUCTOR MANUFACTURING CO., LTD., Hsinchu (TW)

(\*) Notice: Subject to any disclaimer, the term of this patent is extended or adjusted under 35 U.S.C. 154(b) by 134 days.

(21) Appl. No.: 16/939,676

(22) Filed: Jul. 27, 2020

(65) Prior Publication Data

US 2021/0100103 A1 Apr. 1, 2021

Related U.S. Application Data

(60) Provisional application No. 62/907,468, filed on Sep. 27, 2019.

(51) Int. Cl.
*H05K 1/16* (2006.01)
*H01L 49/02* (2006.01)
*H05K 1/11* (2006.01)
*G06F 30/392* (2020.01)

(52) U.S. Cl.
CPC ........... *H05K 1/162* (2013.01); *G06F 30/392* (2020.01); *H01L 28/60* (2013.01); *H05K 1/115* (2013.01)

(58) Field of Classification Search
CPC ..... H01L 27/2418; H01L 28/60; H05K 1/162; H05K 1/115
See application file for complete search history.

(56) References Cited

U.S. PATENT DOCUMENTS

| | | | |
|---|---|---|---|
| 8,436,408 B2 * | 5/2013 | Tu | H01L 27/10894 438/957 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |

(Continued)

*Primary Examiner* — David M Sinclair
*Assistant Examiner* — Daniel M Dubuisson
(74) *Attorney, Agent, or Firm* — Haynes and Boone, LLP

(57) ABSTRACT

An integrated circuit (IC) device according to the present disclosure includes a substrate including a first surface and a second surface opposing the first surface, a redistribution layer disposed over the first surface and including a conductive feature, a passivation structure disposed over the redistribution layer, a metal-insulator-metal (MIM) capacitor embedded in the passivation structure, a dummy MIM feature embedded in the passivation structure and including an opening, a top contact pad over the passivation structure, a contact via extending between the conductive feature and the top contact pad, and a through via extending through the passivation structure and the substrate. The dummy MIM feature is spaced away from the MIM capacitor and the through via extends through the opening of the dummy MIM feature without contacting the dummy MIM feature.

20 Claims, 14 Drawing Sheets

(56) References Cited

U.S. PATENT DOCUMENTS

| | | |
|---|---|---|
| 9,443,783 B2 | 9/2016 | Lin et al. |
| 9,496,189 B2 | 11/2016 | Yu et al. |
| 2004/0173836 A1* | 9/2004 | Oh .................... H01L 27/10885 |
| | | 257/E27.087 |
| 2006/0163638 A1* | 7/2006 | Ito ..................... H01L 21/76816 |
| | | 257/532 |
| 2007/0069384 A1* | 3/2007 | Watanabe ........... H01L 23/5226 |
| | | 257/E21.011 |
| 2007/0125575 A1* | 6/2007 | Inui ....................... H05K 1/162 |
| | | 257/E23.079 |
| 2016/0218172 A1* | 7/2016 | Hsieh ...................... H01L 28/90 |
| 2016/0276426 A1* | 9/2016 | Yang ....................... H01L 28/60 |
| 2019/0013269 A1* | 1/2019 | Zhang ............... H01L 21/76877 |
| 2020/0137883 A1* | 4/2020 | Yoshikawa ............ H05K 3/007 |

\* cited by examiner

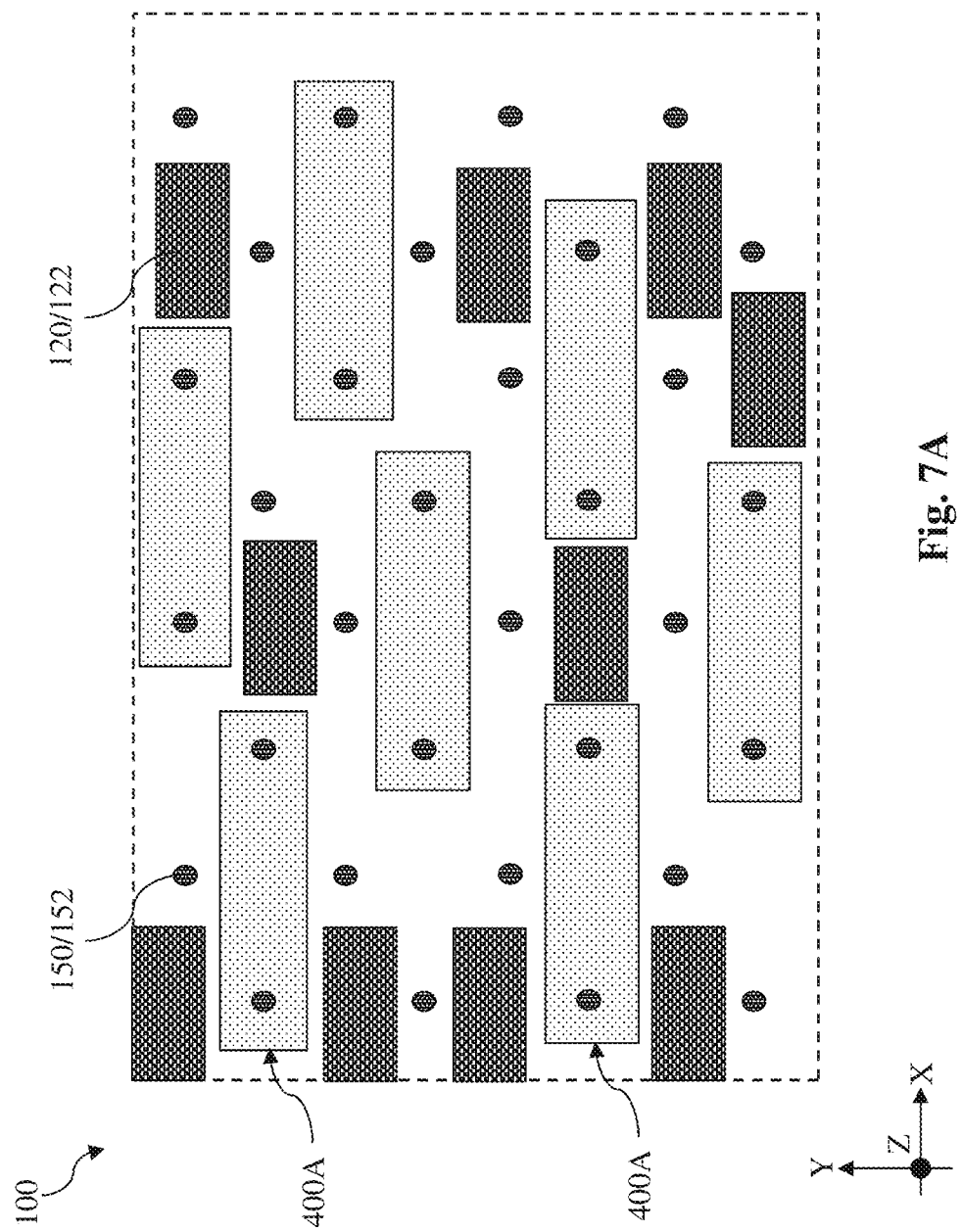

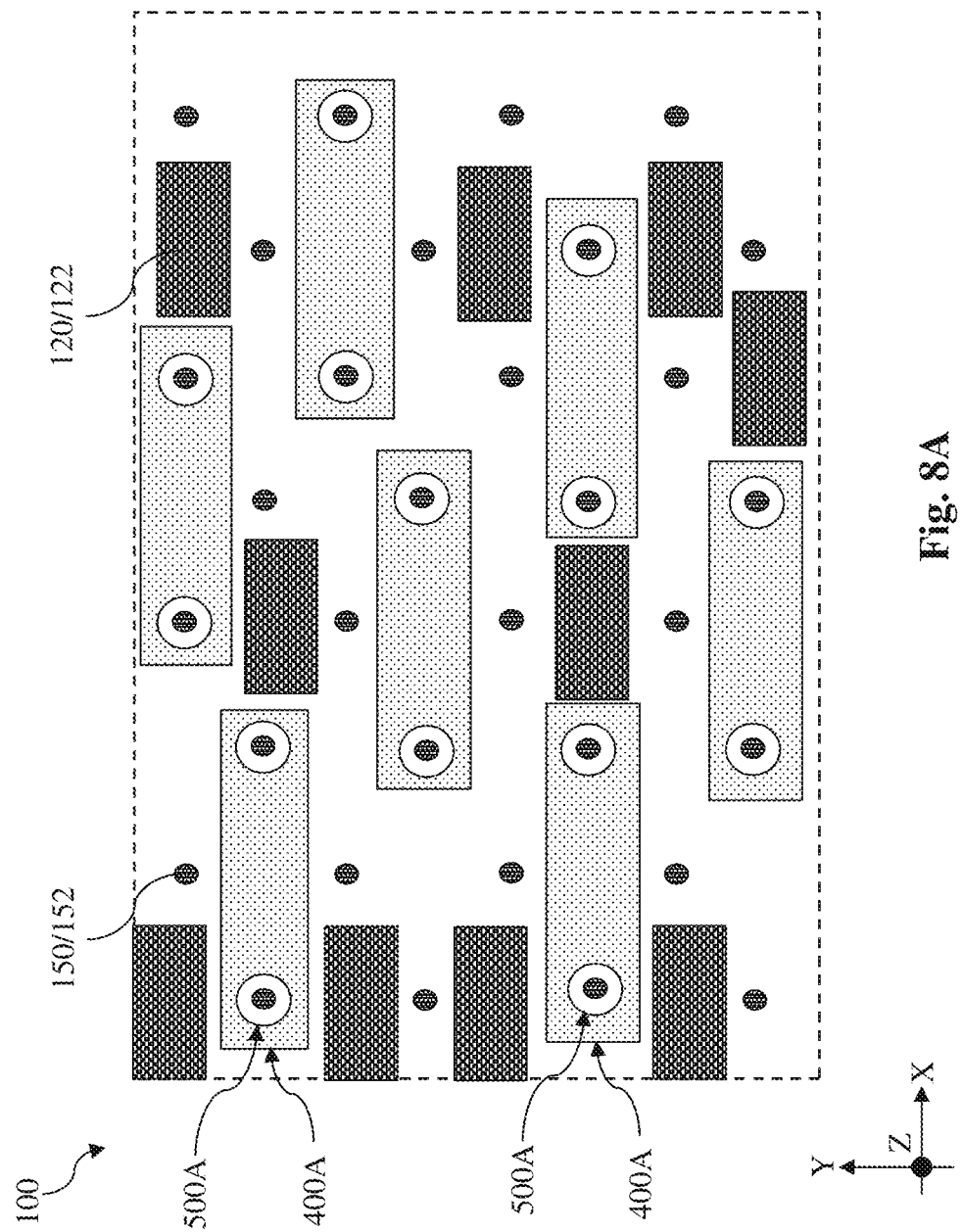

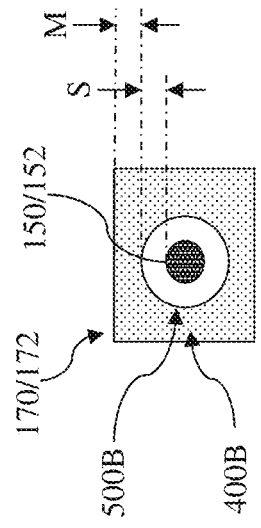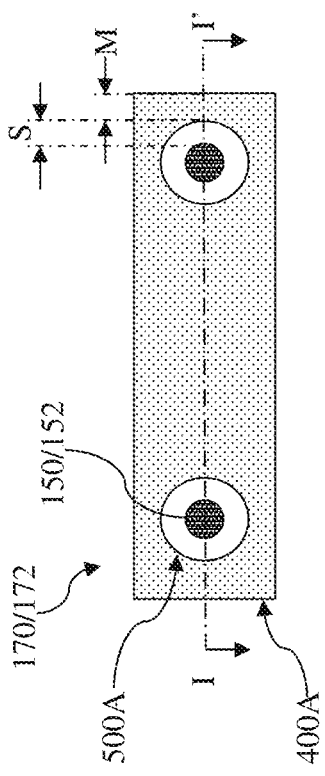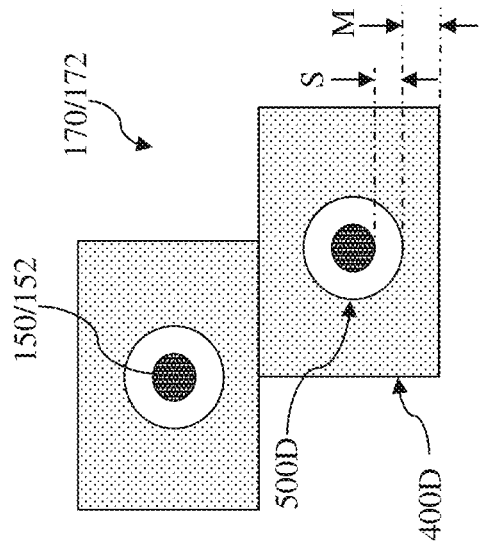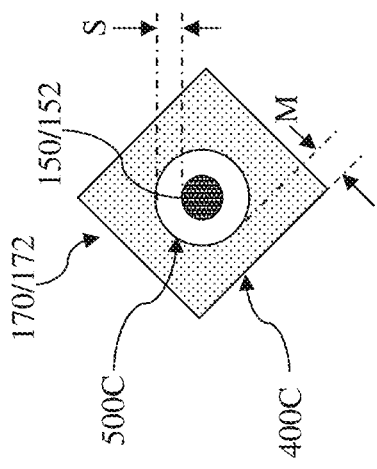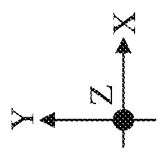

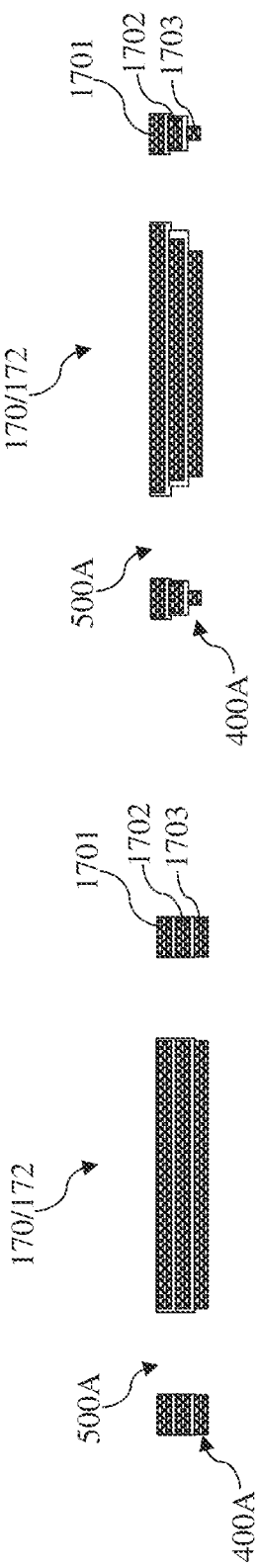
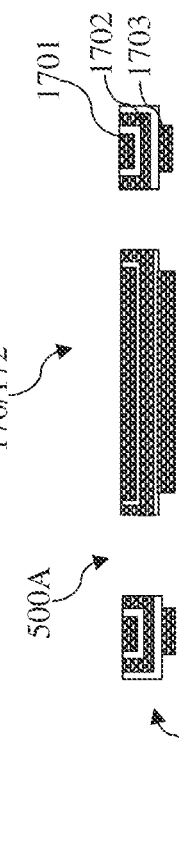
Fig. 10A
Fig. 10B
Fig. 10C

METHOD FOR INSERTING DUMMY CAPACITOR STRUCTURES

PRIORITY DATA

This application claims priority to U.S. Provisional Patent Application No. 62/907,468 filed on Sep. 27, 2019, entitled "SHDMIM DUMMY INSERTION METHOD IN SOIC", the entire disclosure of which is hereby incorporated herein by reference.

BACKGROUND

The semiconductor integrated circuitry (IC) industry has experienced rapid growth. Technological advances in IC design and material have produced generations of ICs where each generation has smaller and more complex circuits than previous generations. During the course of IC evolution, functional density (i.e., the number of interconnected devices per chip area) has generally increased while geometry size (i.e., the smallest component (or line) that can be created using a fabrication process) has decreased.

As the semiconductor device scaling down continues, challenges in fabrication may arise. Passive devices that require large surface areas may be moved to back-end-of-line (BEOL) structures. Metal-Insulator-Metal (MIM) capacitors are among examples of such passive devices. A typical MIM capacitor includes multiple conductor plate layers that are insulated from one another by multiple insulator layers. To alleviate uneven etch loading and non-uniform mechanical strength due to uneven distribution of MIM capacitors, dummy MIM structures having comparable conductor plate layers may be inserted into isolated regions free of MIM capacitors. Presence of through vias that lack long-range orders poses challenges for even distribution of dummy MIM structures, resulting in less-than-optimal reduction of etch loading and reduced mechanical strength. Therefore, although existing semiconductor fabrication methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4, 5, 6A, 6B, 7A, 7B, 8A, and 8B are fragmentary top views of a device at various conceptual stages of the method in FIG. 3, according to aspects of the present disclosure.

FIGS. 9A-9D are schematic top views of example dummy MIM structure, according to aspects of the present disclosure.

FIGS. 10A-10C are schematic cross-sectional view of a dummy MIM structure in FIG. 9A along line I-I', according to aspects of the present disclosure.

DETAILED DESCRIPTION

Figure 1:
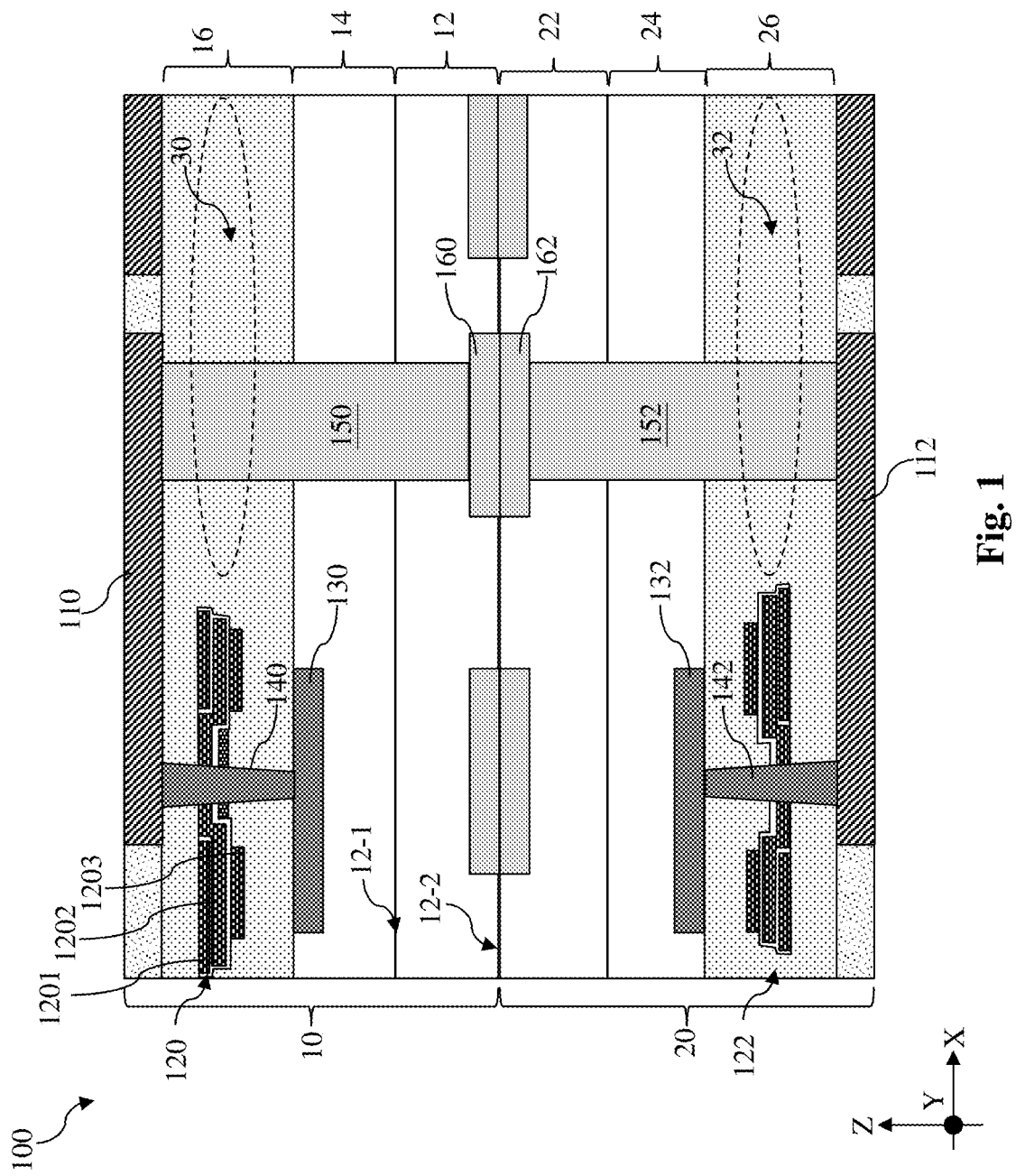
FIG. 1 is a fragmentary cross-sectional view of a device according aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Metal-Insulator-Metal (MIM) capacitors (or super-high-density MIM, SHDMIM) have been widely used in functional circuits such as mixed signal circuits, analog circuits, Radio Frequency (RF) circuits, Dynamic Random Access Memories (DRAMs), embedded DRAMs, and logic operation circuits. In system-on-chip (SOC) or system-on-integrated-circuit (SOIC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes a bottom conductor plate layer, a middle conductor plate layer over the bottom conductor plate layer, and a top conductor plate layer over the middle conductor plate, each of which is insulated from an adjacent conductor plate layer by an insulator layer. As MIM capacitors are fabricated at the BEOL stage to have a larger surface area, they may be embedded in a passivation structure over a redistribution structure or an interconnect structure. MIM capacitors in an IC design may not necessarily have a uniform distribution in the passivation structure. Due to differences in materials, construction, and thermal expansion coefficients, uneven distribution of MIM structures in the dielectric passivation structure can lead to uneven etch loading and stress around the MIM structures and other conductive features. Uneven etch loading may result in etching end-point failure and stress around the MIM structures may result in cracks and delamination.

Dummy MIM structures may be introduced to isolated regions free of MIM structures to provide a more even distribution of MIM structures (or similarly constructed dummy MIM structures) in the passivation layer. However, introduction of dummy MIM structures is not always straightforward. For example, dies in three-dimensional integrated circuit (3DIC) or system on integrated circuit (SOIC) include through vias that may extend through the passivation layer without being electrically coupled to the MIM structures. Such through vias may not be evenly distributed and present hurdles for inserting the dummy MIM structure evenly. As a result, through vias may prevent dummy MIM structures from being distributed evenly in isolated regions free of MIM structures, thereby at least partially defeating the purpose of having the dummy MIM structures in the first place. The present disclosure provides dummy MIM structures and methods for inserting dummy MIM structures to provide an improved distribution of MIM structures or similar structures.

A fragmentary cross-sectional view of an IC device 100 is illustrated in FIG. 1. The IC device 100 may be a semiconductor device die, a semiconductor device package, or a system-on-integrated-circuit (SOIC) device. Depending on the context, the IC device 100 may represent the actual IC device or a design of the IC device 100. In embodiments represented in FIG. 1, the IC device 100 includes a first die 10 that is bonded to a second die 20. Attention is first directed to the first die 10. In some embodiments, the first die 10 includes a first substrate 12. The first substrate 12 includes electrical circuitry fabricated thereon. Such electrical circuitry may include passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The first substrate 12 may also include an elementary semiconductor, a compound semiconductor, or an alloy semiconductor. Examples of an elementary semiconductor include silicon or germanium. Examples of a compound semiconductor include silicon carbide, gallium arsenide, gallium phosphide, indium phosphide, indium arsenide, and/or indium antimonide. Examples of an alloy semiconductor include silicon germanium (SiGe), GaAsP, AnnAs, AlGaAs, GaInAs, GaInP, and/or GaInAsP, or combinations thereof. In some implementations, the first substrate 12 is a semiconductor-on-insulator substrate, such as a silicon-on-insulator (SOI) substrate, a silicon germanium-on-insulator (SGOI) substrate, or a germanium-on-insulator (GOI) substrate. As illustrated in FIG. 1, the first substrate 12 extends along the X-Y plane and has a normal direction along the Z direction. The first substrate 12 includes a first surface 12-1 and an opposing second surface 12-2. In some instances, the electrical circuitry in the first substrate 12 may be disposed adjacent to the first surface 12-1. A first bottom contact pad 160 may be disposed adjacent the second surface 12-2 of the first substrate 12.

The IC device 100 also includes a first redistribution structure 14 (or a first interconnect structure 14) disposed over the first surface 12-1 of the first substrate 12. The first redistribution structure 14 includes various conductive components, such as metal lines, contacts, and vias, to provide horizontal and vertical electrical routing. The metal lines are distributed in multiple metal layers, such as a first metal layer (e.g., a M1 layer), a second metal layer (e.g., a M2 layer), . . . and a first conductive feature 130. The first conductive feature 130 is disposed on a top surface of the first redistribution structure 14 away from the first substrate 12. In some embodiments, the first conductive feature 130 may include copper, aluminum, an alloy thereof, or other conductive materials. In one embodiments, the first conductive feature 130 may include an alloy including about 95% of aluminum and about 5% of copper to provide adhesion with the overlying first passivation structure 16 (to be described below) and may be referred to as a first aluminum (Al) pad 130. Among other things, the conductive components of the first redistribution structure 14 may provide electrical connectivity to the electrical circuitry in the first substrate 12. The first redistribution structure 14 also includes a plurality of dielectric layers to provide electrical isolation among the various conductive components, so as to prevent electrical shorting.

The first die 10 further includes a first passivation structure 16 disposed on the first redistribution structure 14. The first passivation structure 16 may include one or more silicon nitride layers, one or more silicon carbonitride layers, one or more undoped silica glass (USG) layers, one or more silicon oxide layer deposited using high density plasma chemical vapor deposition (HDPCVD), and one or more polymeric layers. The polymeric layers may include polyimides. A first MIM structure 120 is embedded in the first passivation structure 16. In some examples, the first passivation structure 16 includes a silicon nitride layer (or a silicon carbonitride layer) disposed on the first redistribution structure 14 and an USG layer disposed on the silicon nitride layer (or the silicon carbonitride layer). The first MIM structure 120 is disposed on the USG layer and is blanketly covered by another USG layer. In some instances, the first passivation structure 16 also includes one or more polymeric passivation layers disposed over the USG layer covering the first MIM structure 120. Although only the first MIM structure 120 is shown in FIG. 1 for simplicity, the first die 10 includes a plurality of MIM structures similar to the first MIM structure 120.

The first MIM structure 120 may include two or more conductor plate layers. In one embodiment, the first MIM structure 120 includes three conductor plate layers separated by insulator layers. In this embodiment, the first MIM structure 120 includes a bottom conductor plate layer 1201, a middle conductor plate layer 1202 over the bottom conductor plate layer 1201, and a top conductor plate layer 1203 over the middle conductor plate layer 1202. It is noted that the bottom conductor plate layer 1201 is formed first over a workpiece, followed by the middle conductor plate layer

1202, and the top conductor plate layer 1203. If the workpiece is thereafter flipped over, the bottom conductor plate layer 1201 may appear to be on top of the middle conductor plate layer 1202. In some implementations, each of the bottom conductor plate layer 1201, the middle conductor plate layer 1202, and the top conductor plate layer 1203 may be formed of a transition metal or a transition metal nitride, such as titanium (Ti), tantalum (Ta), titanium nitride (TiN), or tantalum nitride (TaN). As compared to copper or aluminum, transition metal or transition metal nitride provides better prevention of electro-migration and oxygen diffusion. Each of the bottom conductor plate layer 1201, the middle conductor plate layer 1202, and the top conductor plate layer 1203 has a thickness between about 40 nm and about 80 nm. Each of the insulator layers between the bottom conductor plate layer 1201 and the middle conductor plate layer 1202 as well as between the middle conductor plate layer 1202 and the top conductor plate layer 1203 may be a single layer or a multi-layer formed of silicon oxide, zirconium oxide, hafnium oxide, aluminum oxide, tantalum oxide, titanium oxide, or a combination thereof. As illustrated in FIG. 1, the first die 10 also includes a first top contact pad 110 disposed on a top surface of the first passivation structure 16 away from the first redistribution structure 14. One or more first contact vias 140 may be extending through a portion of the first MIM structure 120 between the first top contact pad 110 and the first conductive feature 130. The one or more first contact vias 140 provide electrical connection to one or more conductor plate layers in the first MIM structure 120.

The first top contact pad 110 may be formed of a metal or metal alloy, such as copper, cobalt, nickel, aluminum, tungsten, titanium, or a combination thereof. The first die 10 further includes a first through via 150 that extends through the first passivation structure 16, the first redistribution structure 14, and the first substrate 12 to be electrically coupled to the first top contact pad 110 and the first bottom contact pad 160. The first through via 150 may include a metal fill layer lined by a barrier layer. The metal fill layer may include a metal or a metal alloy, such as copper, cobalt, nickel, aluminum, tungsten, titanium, or a combination thereof. The barrier layer may include a transition metal nitride, such as titanium nitride or tantalum nitride. Although only the first through via 150 is shown in FIG. 1 for simplicity, the first die 10 includes a plurality of through vias similar to the first through via 150.

The IC device 100 also includes a second die 20 bonded to the first die 10 described above. For illustration purposes, the second die 20 in FIG. 1 includes features similar to those in the first die 10. For example, the second die 20 includes a second substrate 22 similar to the first substrate 12; a second redistribution layer 24 similar to the first redistribution structure 14; a second passivation structure 26 similar to the first passivation structure 16; a second MIM structure 122 similar to the first MIM structure 120; a second conductive feature 132 similar to the first conductive feature 130; a second through via 152 similar to the first through via 150; a first contact via 140 similar to the second contact via 142; a second top contact pad 112 similar to the first top contact pad 110; and a second bottom contact pad 162 similar to the first bottom contact pad 160. As shown in FIG. 1, the first die 10 and the second die 20 are bonded together such that the first bottom contact pad 160 are in direct contact with the second bottom contact pad 162. Detailed descriptions for similar features in the second die 20 are omitted.

Reference is still made to FIG. 1. Because the first MIM structure 120 is disposed on one side of the first passivation structure 16, a first isolated region 30 free of any MIM structure is resulted. The first isolated region 30 is disrupted by the first through via 150 that extends through the first passivation structure 16, clear of the first MIM structure 120. Similarly, the disposition of the second MIM structure 122 in the second passivation structure 26 leaves a second isolated region 32 free of any MIM structure. In a similar fashion, the second isolated region 32 is disrupted by the second through via 152 that extends through the second passivation structure 26. When the placement of dummy MIM structures steers away from through vias, the dummy MIM structures may not have sufficient density to prevent etch loading and to provide satisfactory mechanical strength.

The present disclosure provides a method for inserting dummy MIM structures in isolated regions, such as the first isolated region 30 and the second isolated region 32. The dummy MIM structures according to the present disclosure include openings to accommodate through vias similar to the first through via 150 and the second through via 152.

Figure 2:
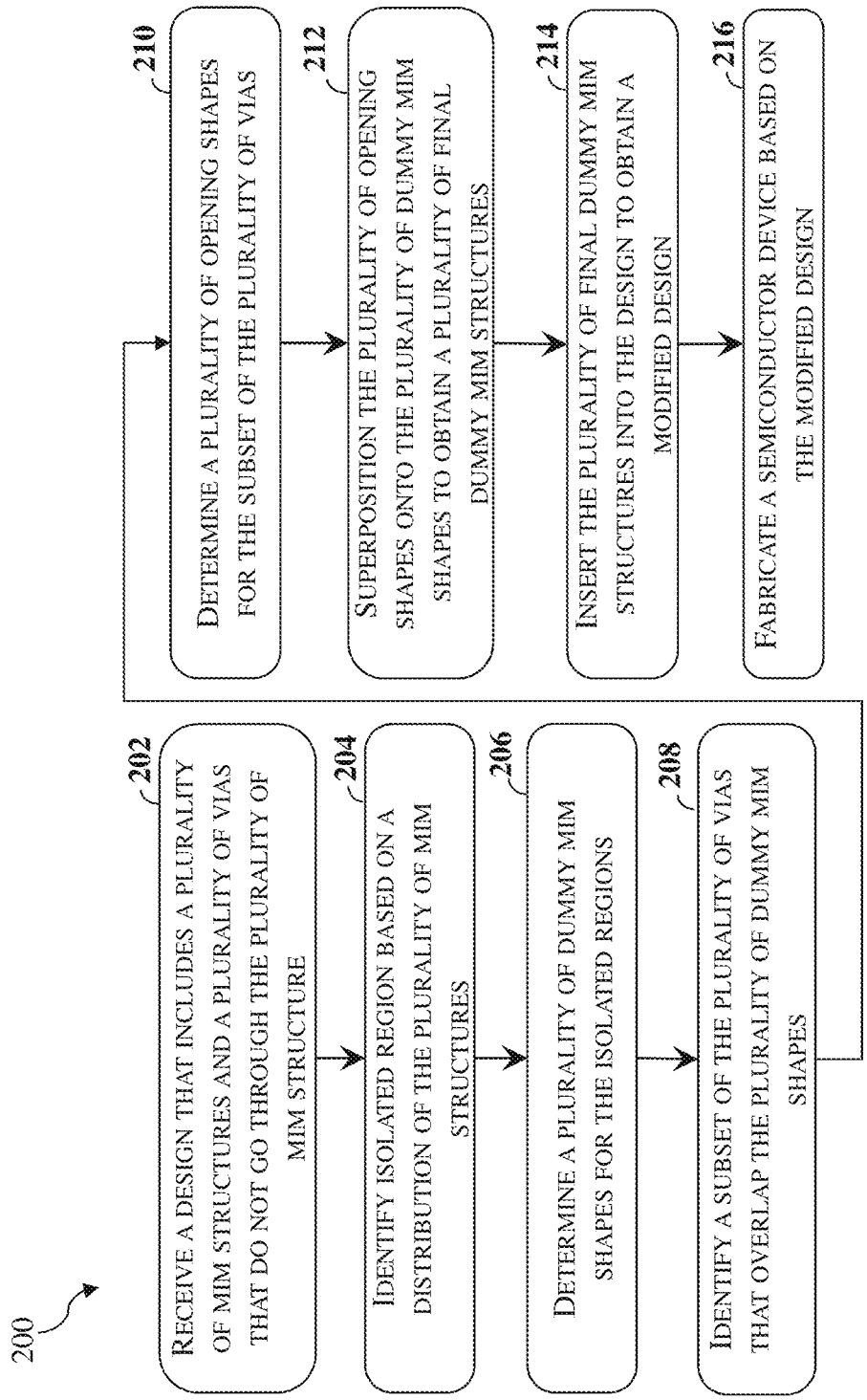
FIG. 2 is a flowchart of a method for inserting dummy metal-insulator-metal (MIM) structures, according to aspects of the present disclosure.

FIG. 2 is a flowchart illustrating a method 200 for fabricating a device according to aspects of the present disclosure. Method 200 is merely an example and is not intended to limit the present disclosure to what is explicitly illustrated in method 200. Additional steps can be provided before, during, and after method 200 and some steps described herein can be replaced, eliminated, or moved around for additional embodiments of the method 200. Not all steps are described herein in details for reasons of simplicity. Method 200 is described below in conjunction with FIGS. 3-5, 6A, 6B, 7A, 7B, 8A, 8B, 9A-9D, and 10.

Figure 3:
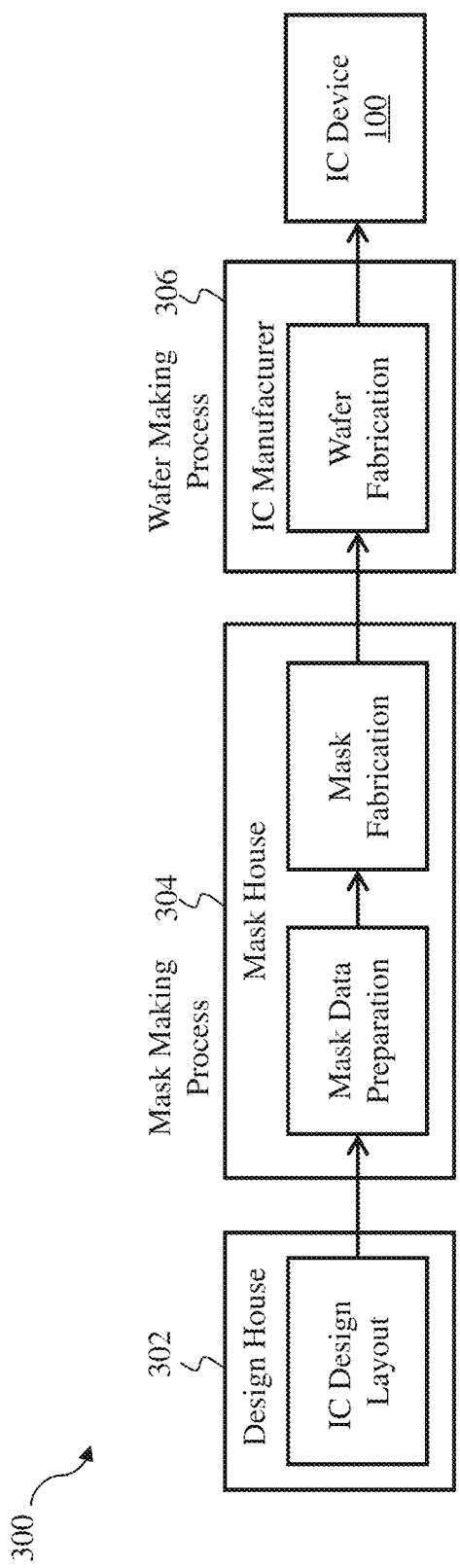
FIG. 3 is a simplified block diagram of an integrated circuit (IC) manufacturing system and associated IC manufacturing flow, according to aspects of the present disclosure.
Figure 4:
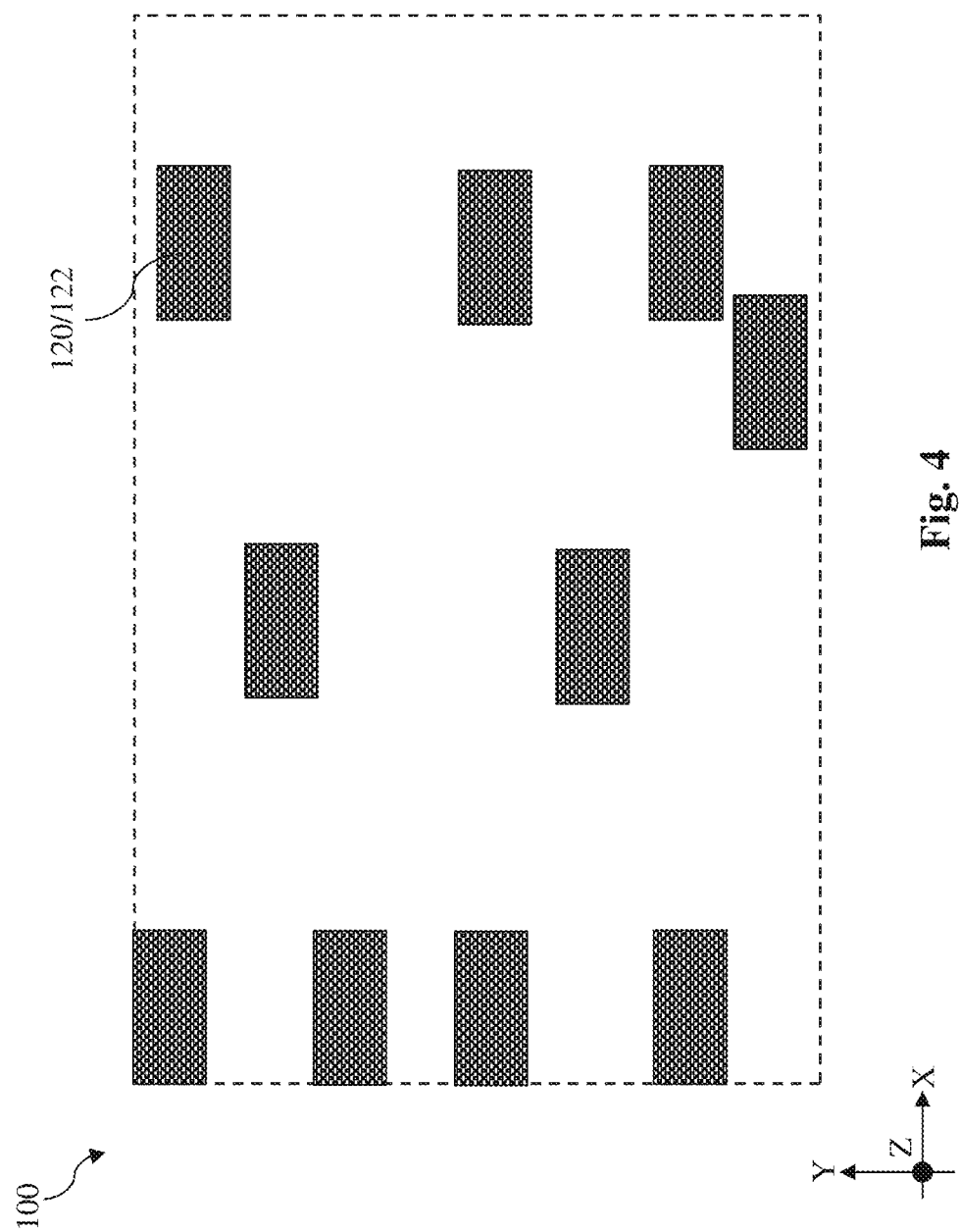
Figure 5:
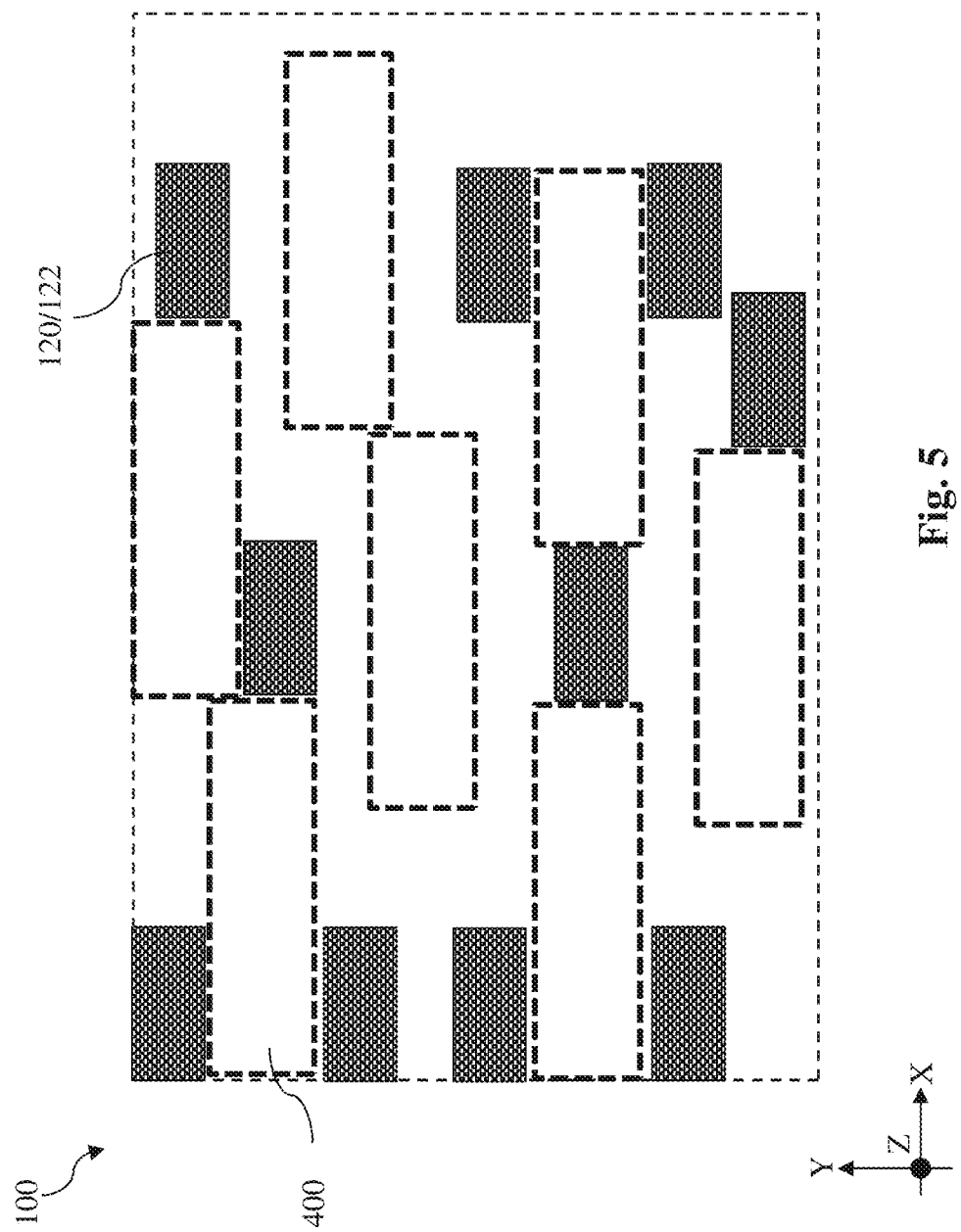

Methods of the present disclosure, such as method 200 in FIG. 2, may be implemented at any point between generation of an IC design layout and the actual fabrication of the mask(s). Reference is now made to FIG. 3, which illustrates a simplified block diagram of an integrated circuit (IC) manufacturing system 300 and associated IC manufacturing flow, which may benefit from various aspects of the present disclosure. The IC manufacturing system 300 includes a plurality of entities, such as a design house 302, a mask house 304, and an IC manufacturer 306 (i.e., an IC fab), that interact with one another in the design, development, and manufacturing cycles and/or services related to manufacturing an integrated circuit (IC) device 100. The plurality of entities is connected by a communications network, which may be a single network or a variety of different networks, such as an intranet and the Internet, and may include wired and/or wireless communication channels. Each entity may interact with other entities and may provide services to and/or receive services from the other entities. One or more of the design house 302, mask house 304, and IC manufacturer 306 may have a common owner, and may even coexist in a common facility and use common resources.

In various embodiments, the design house 302, which may include one or more design teams, generates an IC design layout (i.e., a design). The IC design layout may include various geometrical patterns designed for the fabrication of the IC device 100. By way of example, the geometrical patterns may correspond to patterns of metal, oxide, or semiconductor layers that make up the various components of the IC device 100 to be fabricated. The various layers combine to form various features of the IC device 100. For example, various portions of the IC design layout may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. In various examples, the design house 302 implements a design procedure to form the IC design layout. The design procedure may include logic design, physical design, and/or placement and routing. The IC design layout may be presented in one or more data files having information related to the geometrical patterns which are to be used for fabrication of the IC device 100. In some examples, the IC design layout may be expressed in a GDSII file format or DFII file format.

In some embodiments, the design house 302 may transmit the IC design layout to the mask house 304, for example, via the network connection described above. The mask house 304 may then use the IC design layout to manufacture one or more masks to be used for fabrication of the various layers of the IC device 100 according to the IC design layout. In various examples, the mask house 304 performs mask data preparation, where the IC design layout is translated into a form that can be physically written by a mask writer, and mask fabrication, where the design layout prepared by the mask data preparation is modified to comply with a particular mask writer and/or mask manufacturer and is then fabricated. In the example of FIG. 3, the mask data preparation and mask fabrication are illustrated as separate elements; however, in some embodiments, the mask data preparation and mask fabrication may be collectively referred to as mask preparation.

After mask data preparation and during mask fabrication, a mask or a group of masks may be fabricated based on the modified IC design layout. For example, an electron-beam (e-beam) writer or a mechanism of multiple e-beams is used to form a pattern on a mask (photomask or reticle) based on the modified IC design layout. The mask can be formed in various technologies. In an embodiment, the mask is formed using binary technology. In some embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque region and transmitted through the transparent regions. In one example, a binary mask includes a transparent substrate (e.g., fused quartz) and an opaque material (e.g., chromium) coated in the opaque regions of the mask. In some examples, the mask is formed using a phase shift technology. In a phase shift mask (PSM), various features in the pattern formed on the mask are configured to have a pre-configured phase difference to enhance image resolution and imaging quality. In various examples, the phase shift mask can be an attenuated PSM or alternating PSM.

In some embodiments, the IC manufacturer 306, such as a semiconductor foundry, uses the mask (or masks) fabricated by the mask house 304 to transfer one or more mask patterns onto a wafer and thus fabricate the IC device on the wafer. The IC manufacturer 306 may include an IC fabrication facility that may include a myriad of manufacturing facilities for the fabrication of a variety of different IC products. For example, the IC manufacturer 306 may include a first manufacturing facility for front end fabrication of a plurality of IC products (i.e., front-end-of-line (FEOL) fabrication), while a second manufacturing facility may provide back end fabrication for the interconnection and packaging of the IC products (i.e., back-end-of-line (BEOL) fabrication), and a third manufacturing facility may provide other services for the foundry business (e.g., research and development). In some embodiments, method 200 may be performed after generation of the IC design layout by the design house 302 but before mask fabrication at the mask house 304. In some implementation, method 200 may be performed during mask data preparation using a computer system.

Referring now to FIGS. 1 and 2, method 200 includes a block 202 where a design (i.e., IC design layout) is received. The design may be in GDSII of DFII format and may include features in layers constituting a semiconductor device such as the IC device 100 representatively shown in FIG. 1. In some embodiments, the design may only include features in layers constituting a portion of the IC device 100, such as the first die 10, the second die 20, the first passivation structure 16, or the second passivation structure 26. For example, the design may include a plurality of MIM structures (similar to the first MIM structure 120 and the second MIM structure 122) and a plurality of vias that do not go through the plurality of MIM structures (such as the first through via 150 and the second through via 152). To be more precise, the design may include information about coordinates, dimensions, and shapes of the plurality of MIM structures and the plurality of vias.

Referring to FIGS. 1, 2, 4, and 5, method 200 includes a block 204 where isolated regions are identified based on a distribution of the plurality of MIM structures. As described above in conjunction with FIG. 1, the plurality of MIM structures, such as the first MIM structure 120 and the second MIM structure 122, may not be uniformly distributed across the device in the design. For example, the first passivation structure 16 includes the first isolated region 30 and the second passivation structure 26 includes the second isolated region 32. By using a computer system that is capable of reading and analyzing the design, isolated regions in the same layer of the plurality of MIM structures may be identified based on the distribution of the plurality of MIM structures shown in FIG. 4. In some embodiments represented in FIG. 5, an isolated region template 400 may be stored in a database accessible to the computer system. The isolated region template 400 may be square or rectangular in shape and may have a predetermined area, which may be between about 0.001 times and about 1 times of an average area of the plurality of MIM structures. In some other embodiments, the isolated region template 400 may have a rhombus shape, a diamond shape, or a stair-like shape. In some instances, the isolated region template 400 may have an area between about 1 $\mu m^2$ and about 250000 $\mu m^2$. In these embodiments, a region that is free of any MIM structures may be identified as a part of the isolated regions when the isolated region template 400 may fit in that region. Conversely, a region that is free of any MIM structures may nevertheless be excluded from the isolated regions when the isolated region template 400 does not fit in that region.

Figure 6A:
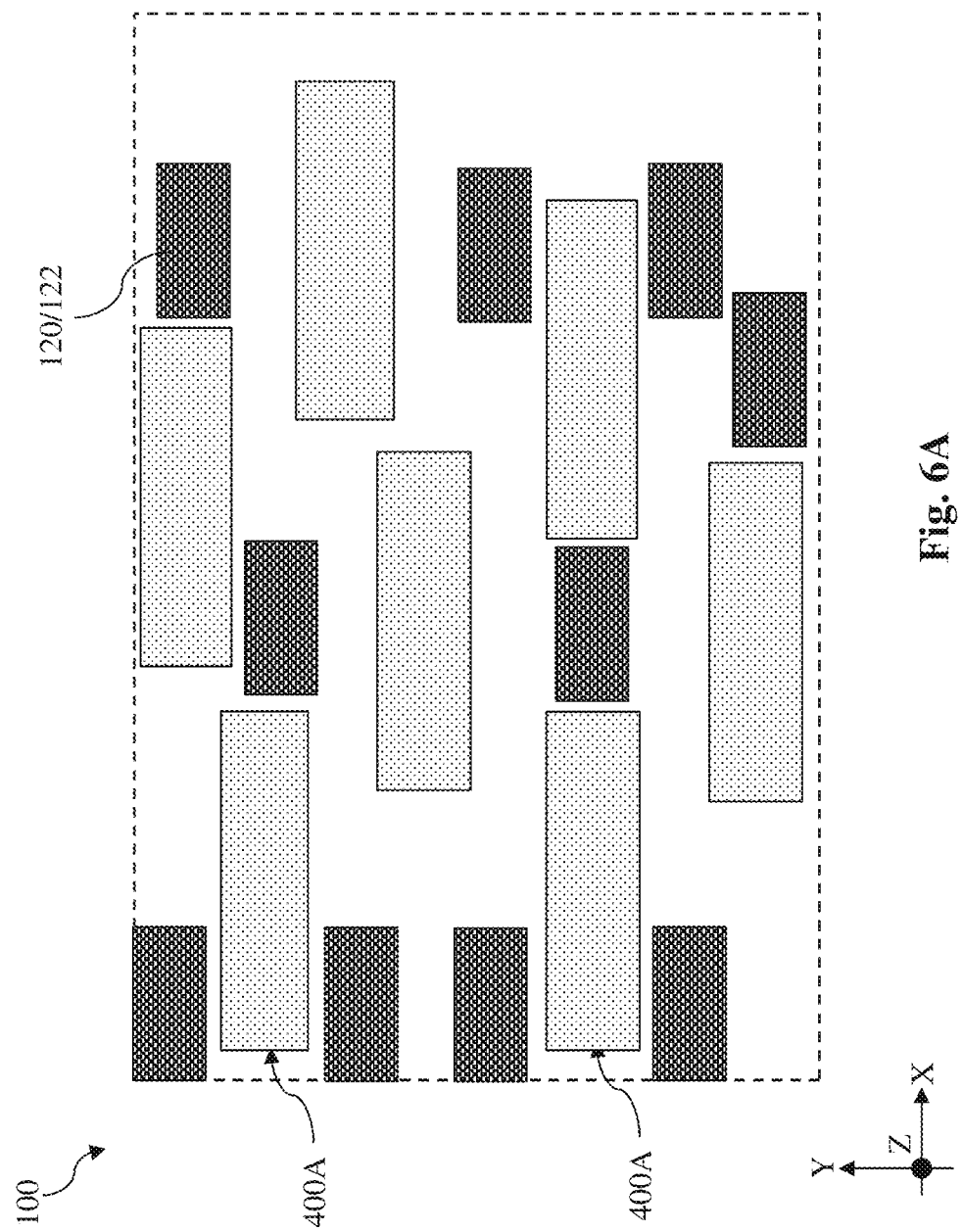
Figure 6B:
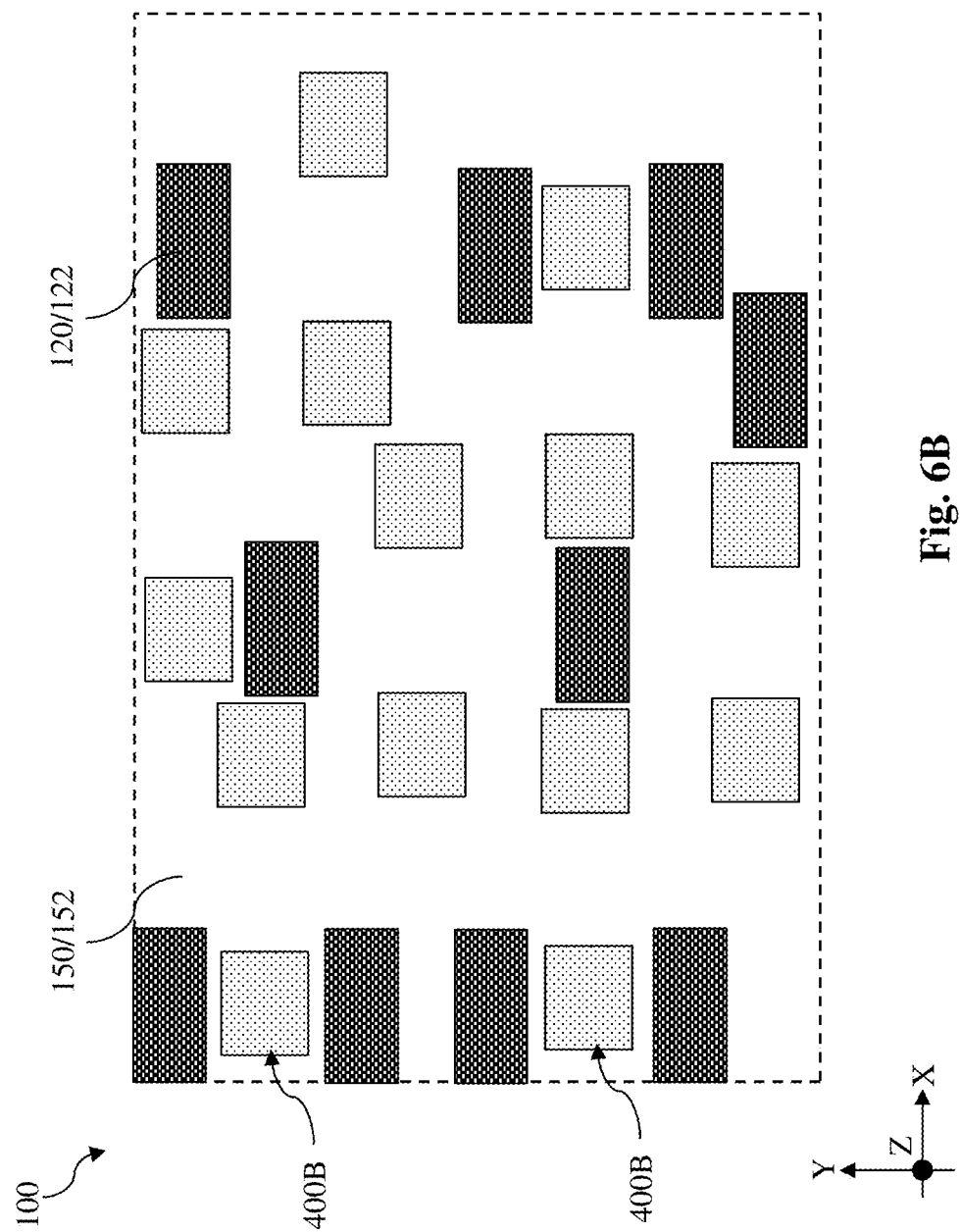

Referring to FIGS. 2, 6A, and 6B, method 200 includes a block 206 where a plurality of dummy MIM shapes (such as rectangular dummy MIM shapes 400A or square dummy MIM shapes 400B) in the isolated regions are determined. For the simplicity of calculation, a plurality of dummy MIM shapes (400A/400B) may be stored in a database accessible by the computer system for performing the method 200. In some embodiments, each of the dummy MIM shapes (400A/400B) may be rectangular (as shown in FIG. 6A, 400A), square (as show in FIG. 6B, 400B), rhombus, or polygonal in shape or may be stair-shaped. In some implementations, the computer system for performing the method 200 operates to select a single dummy MIM shape and fit as many of the dummy MIM shapes in the identified isolated regions. At block 206, the computer system ensures that each of plurality of dummy MIM shapes (such as 400A or 400B) is spaced away from adjacent MIM structures (such as the by a minimum spacing). The minimum spacing may be determined based on process parameters and desired process margins. The minimum spacing is needed to ensure that the dummy MIM shapes are isolated from the MIM structure.

It is noted that at least in some embodiments, operations at block 204 and 206 do not consider the dimensions and shapes of the plurality of vias (such as the first through vias 150 and the second through vias 152 in FIG. 1). That is, operations at blocks 204 and 206 do not regard the plurality of vias as obstructive features in placing the plurality of dummy MIM structures. As will be described below, instead of avoiding the plurality of vias, methods of the present disclosure utilize openings to accommodate the plurality of vias when any of the plurality of vias passes through the dummy MIM structures.

Figure 7B:
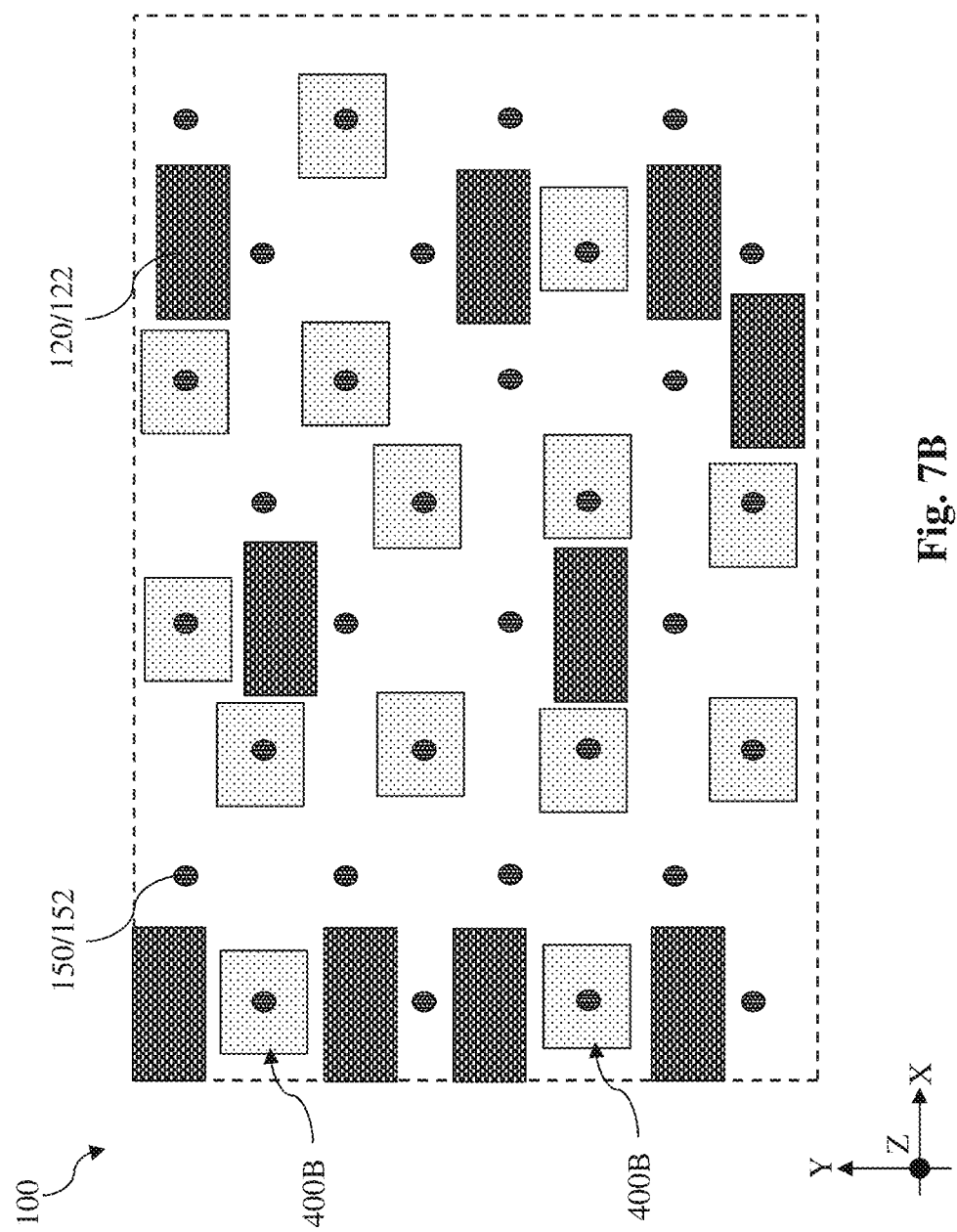

Referring to FIGS. 2, 7A and 7B, method 200 includes a block 208 where a subset of the plurality of vias (such as through vias 150 or 152 shown in FIG. 1) that overlap the plurality of dummy MIM shapes 400A/400B is identified. In some embodiments illustrated in FIGS. 7A and 7B, not all of the plurality of vias (such as through vias 150 or 152 shown in FIG. 1) overlap with the dummy MIM shapes 400A or 400B. The computer system for performing the operations of method 200 may compare the layers of the design that include the dummy MIM shapes 400A or 400B with the layers of the design that include the plurality of vias in order to identify the subset of the plurality of vias that overlap the plurality of dummy MIM shapes.

Figure 8B:
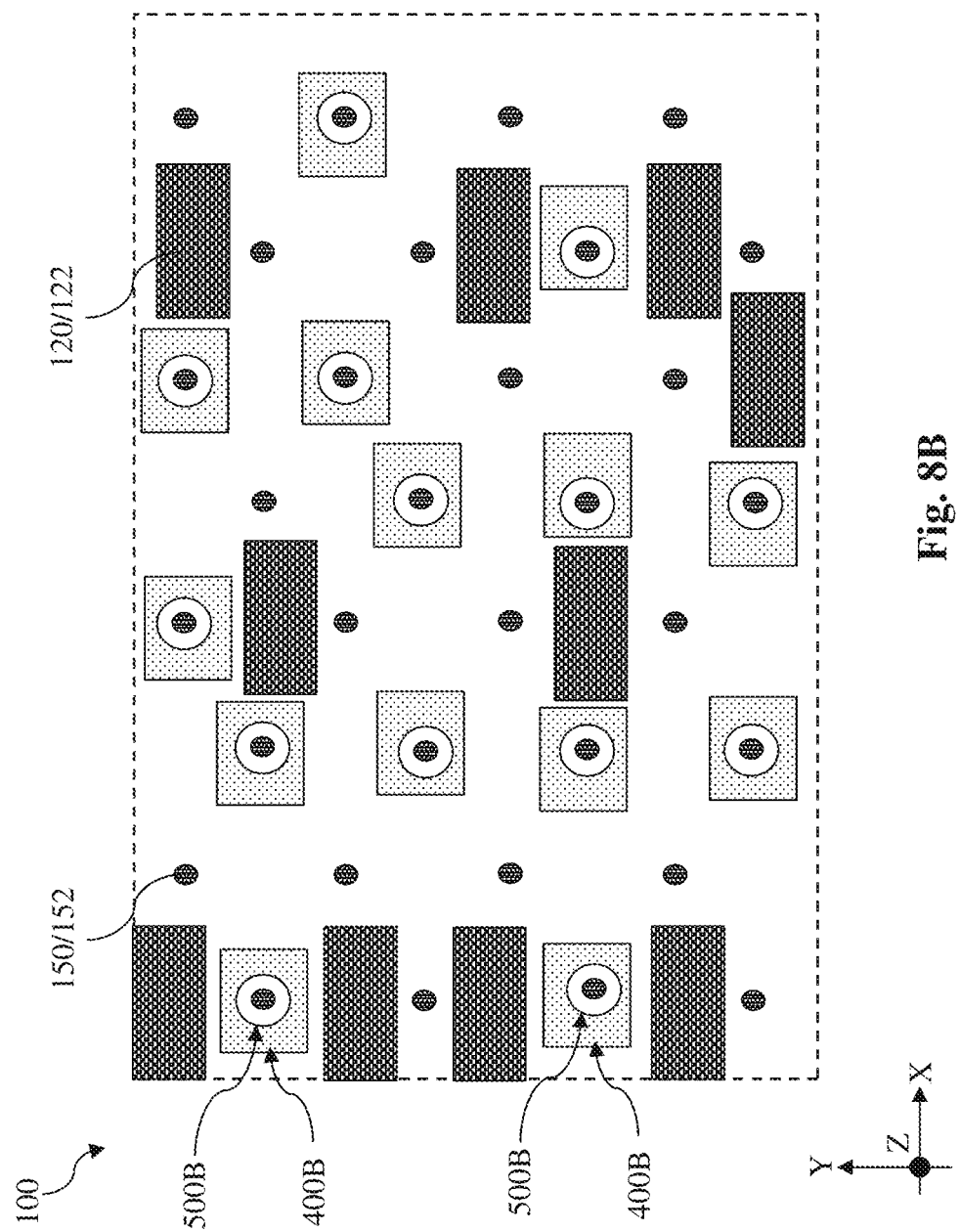

Referring to FIGS. 2, 8A, and 8B, method 200 includes a block 210 where a plurality of opening shapes for the subset of the plurality of vias are determined. In some embodiments shown in FIG. 8A, a first opening shape 500A that overlaps each of the plurality of rectangular dummy MIM shapes 400A is determined. That is, each of the plurality of the rectangular dummy MIM shapes 400A is fitted with a first opening shape 500A. Similarly, in some embodiments shown in FIG. 8B, a second opening shape 500B that overlaps each of the plurality of square dummy MIM shapes 400B is determined. Each of the plurality of square dummy MIM shapes 400B is fitted with a second opening shape 500B. Operations at block 210 continue until all of the subset of the plurality of vias are overlapped with the plurality of opening shapes. In some embodiments shown in FIGS. 8A and 8B, each of the plurality of opening shapes is circular in shape and operations at block 210 are performed such that an areal center or a weight center of each of the plurality of opening shapes is aligned with an areal center or a weight center of each of the plurality of vias. In some instances not specifically shown in FIGS. 8A and 8B, some of the plurality of openings shapes may not land squarely on the plurality of dummy MIM shapes. In these embodiments where each of the plurality of opening shapes is circular, each of the plurality of opening shapes is greater than the via it overlaps in terms of area on the X-Y plane. In other words, a cross-sectional area of the opening is greater than that of the via along the Z direction, which is perpendicular to the substrate or die.

Referring to FIGS. 2 and 9A-9D, method 200 includes a block 212 where the plurality of opening shapes are super-positioned onto the plurality of dummy MIM shapes to obtain a plurality of final dummy MIM structures. After the plurality of dummy MIM shapes are determined based on the distribution of the plurality of MIM structures at block 208 and plurality of opening shapes are fitted onto the subset of plurality of vias at block 210, the plurality of opening shapes are super-positioned onto the plurality of the dummy MIM shapes at block 212 to obtain the final dummy MIM structures. Examples of the such super-position are shown in FIGS. 9A-9D. Referring to FIG. 9A, a first opening shape 500A is super-positioned onto a rectangular dummy MIM shape 400A to obtain a final dummy MIM structure (similar to the dummy MIM structure 170 or 172 in FIG. 11). Referring to FIG. 9B, a second opening shape 500B is super-positioned onto a square dummy MIM shape 400B to obtain a final dummy MIM structure (similar to the dummy MIM structure 170 or 172 in FIG. 11). Referring to FIG. 9C, a third opening shape 500C is super-positioned onto a diamond or rhombus dummy MIM shape 400C to form a final dummy MIM structure (similar to the dummy MIM structure 170 or 172 in FIG. 11). Referring to FIG. 9D, a fourth opening shape 500D is super-positioned onto a stair-shaped dummy MIM shape 400D to obtain a final dummy MIM structure (similar to the dummy MIM structure 170 or 172 in FIG. 11). Each of the opening shapes in FIGS. 9A-9D represents an opening in the respective MIM structure to accommodate one of the plurality of vias.

Referring to FIG. 2, method 200 includes a block 214 where the plurality of final dummy MIM structures are inserted into the design to obtain a modified design. At block 214, the final dummy MIM structures representatively shown in FIGS. 9A-9D are inserted into the design to obtain a modified design. Reference is made to FIG. 3. In terms of the IC manufacturing flow, the final dummy MIM structures in FIGS. 9A-9D may be inserted into the design (i.e., IC design layout) received from the design house 302 to obtain a modified design.

To ensure satisfactory process windows and avoid undesirable capacitance, each of the first opening shape 500A, second opening shape 500B, third opening shape 500C, and the fourth opening shape 500D is substantially coaxial with the first through via 150 (or the second through via 152, as the case may be) and is spaced apart from the first through via 150 (or the second through via 152, as the case may be) by a spacing S. In some instances, the spacing S may be between about 1 µm and about 2 µm. To ensure uniform stress distribution and to prevent crack propagation, the edges of the first opening shape 500A, second opening shape 500B, third opening shape 500C, and the fourth opening shape 500D spaced apart from an edge of the first dummy MIM structure 170 (or the second dummy MIM structure 172, as the case may be) by a minimum margin M. In some instances, the minimum margin M is between about 1 µm and about 2 µm. It is observed that when the spacing S is less than 1 µm, the process window may be reduced as overlay errors may cause the first through via 150 (or the second through via 152) to come in contact with the first dummy MIM structure 170 (or the second dummy MIM structure 172). When the spacing S and the minimum margin M are greater than 2 µm, the overall dimension of the first dummy MIM structure 170 (or the second dummy MIM structure 172) may be too large, making it less efficient to be inserted into the isolated regions.

The dummy MIM structure may have different dummy conductor plate arrangements. To illustrate, example cross-sectional views of the dummy MIM structure in FIG. 9A along line I-I' is illustrated in FIGS. 10A, 10B, and 10C. As shown in FIGS. 10A, 10B and 10C, the first dummy MIM structure 170 (or the second dummy MIM structure 172, as the case may be) includes a bottom dummy conductor plate layer 1701, a middle dummy conductor plate layer 1702 over the bottom dummy conductor plate layer 1701, and a top dummy conductor plate layer 1703 over the middle dummy conductor plate layer 1702. Out of these three dummy conductor plate layers, the bottom dummy conductor plate layer 1701 is formed first and the middle dummy conductor plate layer 1702 and the top dummy conductor plate layer 1703 are sequentially formed over the bottom dummy conductor plate layer 1701. In some embodiments, like the conductor plate layers in the first MIM structure 120 and the second MIM structure 122, the bottom dummy conductor plate layer 1701, the middle dummy conductor plate layer 1702, and the top dummy conductor plate layer 1703 are insulated from one another by at least one insulator layers. Depending on the orientation of the first die 10 and the second die 20, the bottom dummy conductor plate layer 1701 may come out on top for the first dummy MIM structure 170 or may drop to the bottom for the second dummy MIM structure 172. The different orientations are shown in FIG. 11 (to be described below).

In some embodiments represented in FIG. 10A, the bottom dummy conductor plate layer 1701, the middle dummy conductor plate layer 1702, and the top dummy conductor plate layer 1703 are coextensive and the first opening shape 500A is duplicated in each of the dummy conductor plate layers. In some embodiments represented in FIG. 10B, the first opening shape 500A is accommodated in the bottom dummy conductor plate layer 1701 but the openings in the middle dummy conductor plate layer 1702 and the top dummy conductor plate layer 1703 are larger than the first opening shape 500A. In some embodiments represented in FIG. 10C, the bottom dummy conductor plate layer 1701 is patterned before the deposition of the middle dummy conductor plate layer 1702 such that the middle dummy conductor plate layer 1702 may extend over sidewalls of the bottom dummy conductor plate layer 1701. In the embodiments shown in FIG. 10C, the first opening shape 500A is defined by the patterns in the middle dummy conductor plate layer 1702. Similar dummy conductor plate layer arrangements may be implemented in embodiments in the dummy MIM structure shown in FIG. 9B, 9C or 9D.

Figure 11:
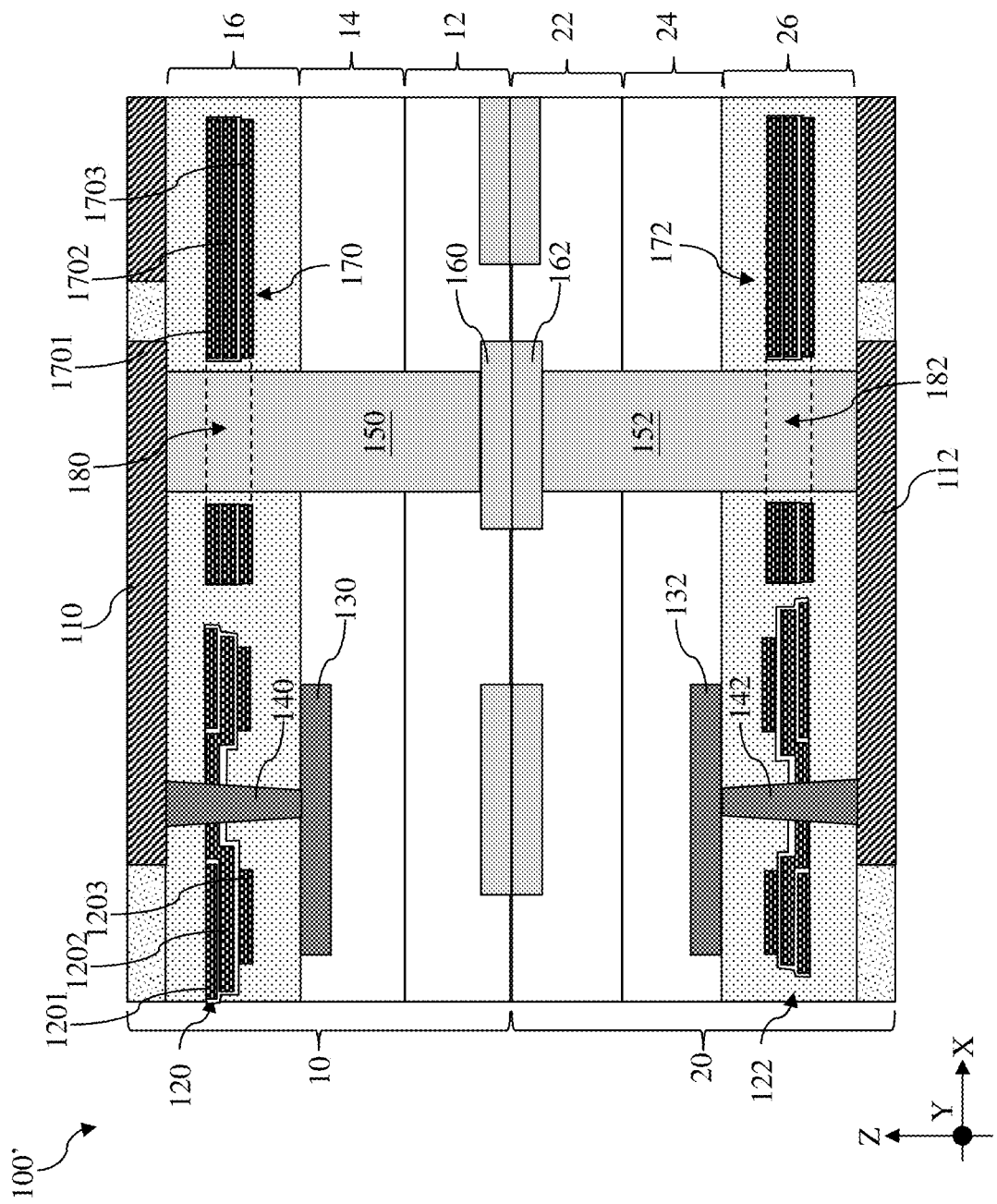
FIG. 11 is a fragmentary top view of a device according to aspects of the present disclosure.

Referring to FIGS. 2 and 11, method 200 includes a block 216 where an IC device 100' is fabricated based on the modified design. In some instances, the mask house 304 may fabricate masks based on the modified design obtained at block 214 and deliver the masks to the IC manufacturer 306. The IC manufacturer 306 may then fabricate the IC device 100' shown in FIG. 11. At this point, the dummy MIM structures inserted into the modified design are embodied in the IC device 100'. As compared to the IC device 100 in FIG. 1, the IC device 100' additionally includes a first dummy MIM structure 170 in the first isolated region 30 in FIG. 11 and a second dummy MIM structure 172 in the second isolated region 32 in FIG. 11. With respect to the first die 10 in FIG. 11, the first dummy MIM structure 170 is one of a plurality of dummy MIM structures disposed in isolated regions in the IC device 100'. With respect to the first die 20 in FIG. 11, the second dummy MIM structure 172 is one of a plurality of dummy MIM structures disposed in isolated regions in the IC device 100'. The first dummy MIM structure 170 includes a first opening 180 to accommodate the first through via 150. With respect to the X-Y cross-sectional plane, the first opening 180 is greater than the first through via 150 such that the first dummy MIM structure 170 is spaced apart from the first through via 150. Similarly, the second dummy MIM structure 172 includes a second opening 182 to accommodate the second through via 152. With respect to the X-Y cross-sectional plane, the second opening 182 is greater than the second through via 152 such that the second dummy MIM structure 172 is spaced apart from the second through via 152.

The first dummy MIM structure 170 and the second dummy MIM structure 172 are shown in FIG. 11 as having dummy conductor plate layer arrangements similar to those shown in FIG. 10A. In other embodiments, they may have dummy conductor plate layer arrangement shown in FIG. 10B or 10C. For the avoidance of doubts, the first dummy MIM structure 170 and the second dummy MIM structure 172 may have the shapes, structures and openings illustrated in FIG. 9A, 9B, 9C, or 9D. For example, the first opening 180 and the second opening 182 may correspond to the first opening shape 500A in FIG. 9A, the second opening shape 500B in FIG. 9B, the third opening shape 500C in FIG. 9C, or the fourth opening shape 500D in FIG. 9D.

The dummy MIM structures of the present disclosure include structures substantially comparable to those of functional MIM structures. Reference is still made to FIG. 11. As described above, the first MIM structure 120 includes a bottom conductor plate layer 1201, a middle conductor plate layer 1202, and a top conductor plate layer 1203. In some implementations, each of the bottom conductor plate layer 1201, the middle conductor plate layer 1202, and the top conductor plate layer 1203 may be formed of a transition metal or a transition metal nitride, such as titanium (Ti), tantalum (Ta), titanium nitride (TiN), or tantalum nitride (TaN). In some implementations illustrated in FIG. 11, the first dummy MIM structure 170 includes a bottom dummy conductor plate layer 1701, a middle dummy conductor plate layer 1702 over the bottom dummy conductor plate layer 1701, and a top dummy conductor plate layer 1703 over the middle dummy conductor plate layer 1702. Each of the bottom dummy conductor plate layer 1701, the middle dummy conductor plate layer 1702, and the top dummy conductor plate layer 1703 may be formed of a transition metal or a transition metal nitride, such as titanium (Ti), tantalum (Ta), titanium nitride (TiN), or tantalum nitride (TaN). The bottom conductor plate layer 1201 and the bottom dummy conductor plate layer 1701 may be formed simultaneously in the same process steps. In similar fashion, the middle conductor plate layer 1202 and the middle dummy conductor plate layer 1702 may be formed simultaneously and the top conductor plate layer 1203 and the top dummy conductor plate layer 1703 may be formed simultaneously. In some instances, at least a portion of the bottom conductor plate layer 1201 may be coplanar with at least a portion of the bottom dummy conductor plate layer 1701; at least a portion of the middle conductor plate layer 1202 may be coplanar with at least a portion of the middle dummy conductor plate layer 1702; and at least a portion of the top conductor plate layer 1203 may be coplanar with at least a portion of the top dummy conductor plate layer 1703. Like the first MIM structure 120, the bottom dummy conductor plate layer 1701, the middle dummy conductor plate layer 1702, and the top dummy conductor plate layer 1703 are respectively insulated from one another by one or more insulator layers. The same may be said with respect to the second MIM structure 122 and the second dummy MIM structure 172. The second MIM structure 122 and the second dummy MIM structure 172 may have similar compositions formed in the same process steps. The dummy conductor plate layers in the second dummy MIM structure 172 are also insulated from one another by one or more insulator layers. Different from the functional first MIM structure 120 and the second MIM structure 122, the first dummy MIM structure 170 and the second dummy MIM structure 172 are electrically floating. That is, the first dummy MIM structure 170 and the second dummy MIM structure 172 are not electrically coupled to any functional structures in the IC device 100'.

Based on the above discussions, it can be seen that the present disclosure offers advantages over conventional methods and devices. It is understood, however, that other embodiments may offer additional advantages, and not all advantages are necessarily disclosed herein, and that no particular advantage is required for all embodiments. One advantage is that the methods of the present disclosure allow insertion of dummy MIM structures around through vias to provide an improved distribution of MIM structure or dummy MIM structures, so as to prevent uneven etch loading or cracks around the MIM structures. Another advantage is that methods of the present disclosure consider presence of the through vias without letting the through vias to obstruct insertion dummy MIM structures.

Thus, the present disclosure provides an IC device. The IC device includes a substrate including a first surface and a second surface opposing the first surface, a redistribution layer disposed over the first surface and including a conductive feature, a passivation structure disposed over the redistribution layer, a metal-insulator-metal (MIM) capacitor embedded in the passivation structure, a dummy MIM feature embedded in the passivation structure and including an opening, a top contact pad over the passivation structure, a contact via extending between the conductive feature and the top contact pad, and a through via extending through the passivation structure and the substrate. The dummy MIM feature is spaced away from the MIM capacitor and the through via extends through the opening of the dummy MIM feature without contacting the dummy MIM feature.

In some embodiments, the conductive feature includes aluminum. In some implementations, the MIM capacitor includes a first bottom conductor plate, a first middle conductor plate over the first bottom conductor plate, and a first top conductor plate over the first middle conductor plate. In some instances, the dummy MIM feature includes a second bottom conductor plate, a second middle conductor plate over the second bottom conductor plate, and a second top conductor plate over the second middle conductor plate. In some implementations, the first bottom conductor plate and the second bottom conductor plate are coplanar. In oms instances, the dummy MIM feature is electrically floating. In some embodiments, the opening is circular. In some implementations, the dummy MIM feature includes a square shape, a rectangular shape, or a stair shape when viewed from a direction normal to the substrate. In some embodiments, the IC device may further include a bottom contact pad over the second surface of the substrate, wherein the through via extends between and is electrically coupled to the top contact pad and the bottom contact pad.

The present disclosure also provides a method. The method includes receiving a design that includes a plurality of metal-insulator-metal (MIM) structures and a plurality of vias that do not extend through the plurality of MIM structures, determining a plurality of dummy MIM shapes, identifying a subset of the plurality of vias that overlap the plurality of dummy MIM shapes, determining a plurality of opening shapes over the subset of the plurality of vias, super-positioning the plurality of dummy MIM shapes and the plurality of opening shapes to obtain a plurality of final dummy MIM structures, and inserting the plurality of final dummy MIM structures in the design to obtain a modified design.

In some embodiments, each of the plurality of dummy MIM shapes includes a square shape, a rectangular shape, or a stair shape. In some implementations, each of the plurality of opening shapes includes a circular shape. In some embodiments, the determining of the plurality of dummy MIM shapes is based on a distribution of the plurality of MIM structures. In some instances, each of the plurality of MIM structures and each of the plurality of final dummy MIM structures include a bottom conductor plate, a middle conductor plate over the bottom conductor plate, and a top conductor plate over the middle conductor plate. In some embodiments, the method may further include fabricating an integrated circuit (IC) device based on the modified design. In some implementations, the fabricating of the IC device includes simultaneously forming the plurality of MIM structures and the plurality of final dummy MIM structures.

The present disclosure further provides a method. The method includes receiving a design that includes a substrate, a redistribution layer disposed over the substrate and including a conductive feature, a passivation structure disposed over the redistribution layer, a plurality of metal-insulator-metal (MIM) capacitors embedded in the passivation structure, and a plurality of through via extending through the passivation structure and the substrate, the plurality of through via being spaced apart from the plurality of MIM capacitors. The method further includes determining a plurality of dummy MIM shapes based on a distribution of the plurality of MIM capacitors in the passivation structure, identifying a subset of the plurality of through vias that overlap the plurality of dummy MIM shapes, determining a plurality of opening shapes over the subset of the plurality of through vias, super-positioning the plurality of dummy MIM shapes and the plurality of opening shapes to obtain a plurality of final dummy MIM structures, and inserting the plurality of final dummy MIM structures in the design to obtain a modified design.

In some embodiments, each of the plurality of opening shapes is greater than a cross sectional area of each of the subset of the plurality of though vias along a direction perpendicular to the substrate. In some implementations, each of the plurality of dummy MIM shapes includes a square shape, a rectangular shape, or a stair shape and each of the plurality of opening shapes includes a circular shape. In some instances, the method may further include fabricating an integrated circuit (IC) device based on the modified design.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. An integrated circuit (IC) device, comprising:
 a substrate including a first surface and a second surface opposing the first surface;
 a redistribution layer disposed over the first surface and including a conductive feature;
 a passivation structure disposed over the redistribution layer;
 a metal-insulator-metal (MIM) capacitor embedded in the passivation structure;

a dummy MIM feature embedded in the passivation structure and comprising an opening;
a top contact pad over the passivation structure;
a contact via extending between the conductive feature and the top contact pad; and
a through via extending through the passivation structure and the substrate,
wherein the dummy MIM feature is spaced away from the MIM capacitor,
wherein the through via extends through the opening of the dummy MIM feature without contacting the dummy MIM feature.

2. The IC device of claim 1, wherein the conductive feature comprises aluminum.

3. The IC device of claim 1, wherein the MIM capacitor comprises a first bottom conductor plate, a first middle conductor plate over the first bottom conductor plate, and a first top conductor plate over the first middle conductor plate.

4. The IC device of claim 3, wherein the dummy MIM feature comprises a second bottom conductor plate, a second middle conductor plate over the second bottom conductor plate, and a second top conductor plate over the second middle conductor plate.

5. The IC device of claim 4, wherein the first bottom conductor plate and the second bottom conductor plate are coplanar.

6. The IC device of claim 1, wherein the dummy MIM feature is electrically floating.

7. The IC device of claim 1, wherein the opening is circular.

8. The IC device of claim 1, wherein the dummy MIM feature comprises a square shape, a rectangular shape, or a stair shape when viewed from a direction normal to the substrate.

9. The IC device of claim 1, further comprising:
a bottom contact pad over the second surface of the substrate, wherein the through via extends between and is electrically coupled to the top contact pad and the bottom contact pad.

10. A device structure, comprising:
a substrate;
a redistribution layer disposed over the substrate;
a passivation structure disposed over the redistribution layer;
a dummy metal-insulator-metal (MIM) feature embedded in the passivation structure and comprising:
 a plurality of conductor plate layers,
 a plurality of insulator layers interleaving the plurality of conductor plate layer, and
 an opening through the plurality conductor plate layers and the plurality of insulator layers; and
a through via extending through the passivation structure, the opening, the redistribution layer, and the substrate,
wherein the plurality of the conductor plate layers are electrically floating.

11. The device structure of claim 10,
wherein the redistribution layer comprises a plurality of metal lines and a plurality of vias,
wherein the plurality of the conductor plate layers are electrically insulated from the plurality of metal lines and the plurality of vias.

12. The device structure of claim 10, wherein the substrate comprises an elementary semiconductor, a compound semiconductor, or an alloy semiconductor.

13. The device structure of claim 10, wherein the plurality of conductor plate layers comprise titanium, tantalum, titanium nitride, or tantalum nitride.

14. The device structure of claim 10, wherein the plurality of insulator layers comprise silicon oxide, zirconium oxide, hafnium oxide, aluminum oxide, tantalum oxide, titanium oxide, or a combination thereof.

15. A device structure, comprising:
a first passivation structure;
a first dummy metal-insulator-metal (MIM) feature disposed in the first passivation structure and comprising a first through opening;
a first redistribution layer disposed over the first passivation structure;
a first substrate disposed over the first redistribution layer;
a first through via extending through the first passivation structure, the first through opening, the first redistribution layer, and at least a portion of the first substrate;
a second substrate disposed over the first substrate;
a second redistribution layer disposed over the second substrate;
a second passivation structure disposed over the second redistribution layer;
a second dummy MIM feature disposed in the second passivation structure and comprising a second through opening; and
a second through via extending through the second passivation structure, the second through opening, the second redistribution layer, and at least a portion of the second substrate,
wherein first through via is electrically insulated from the first dummy MIM feature and the second through via is electrically insulated from the second dummy MIM feature.

16. The device structure of claim 15, further comprising:
a first contact pad disposed directly on the first through via; and
a second contact pad disposed directly between the first contact pad the second through via.

17. The device structure of claim 15,
wherein the first redistribution layer comprises a first plurality of metal lines and a first plurality of vias, and
wherein the second redistribution layer comprises a second plurality of metal lines and a second plurality of vias.

18. The device structure of claim 17,
wherein the first dummy MIM feature comprises:
 a first plurality of conductor plate layers, and
 a first plurality of insulator layers interleaving the first plurality of conductor plate layer,
wherein the second dummy MIM feature comprises:
 a second plurality of conductor plate layers, and
 a second plurality of insulator layers interleaving the second plurality of conductor plate layer,
wherein the first plurality of the conductor plate layers are electrically insulated from the first plurality of metal lines and the first plurality of vias,
wherein the second plurality of the conductor plate layers are electrically insulated from the second plurality of metal lines and the second plurality of vias.

19. The device structure of claim 15, wherein the first through via and the second through via comprise copper, cobalt, nickel, aluminum, tungsten, titanium, or a combination thereof.

20. The device structure of claim 15, wherein the second substrate is in direct contact with the first substrate.

\* \* \* \* \*